United States Patent
Hodes et al.

(10) Patent No.: US 9,025,330 B2
(45) Date of Patent: May 5, 2015

(54) RECIRCULATING GAS RACK COOLING ARCHITECTURE

(75) Inventors: Marc Hodes, Dublin (IE); Alan Michael Lyons, New Providence, NJ (US); William Harold Scofield, Batavia, IL (US)

(73) Assignee: Alcatel Lucent, Boulogne Billancourt (FR)

(*) Notice: Subject to any disclaimer, the term of this patent is extended or adjusted under 35 U.S.C. 154(b) by 53 days.

(21) Appl. No.: 11/865,020

(22) Filed: Sep. 30, 2007

(65) Prior Publication Data

US 2009/0086434 A1 Apr. 2, 2009

(51) Int. Cl.
*H05K 7/20* (2006.01)

(52) U.S. Cl.
CPC ........ *H05K 7/20754* (2013.01); *H05K 7/20609* (2013.01)

(58) Field of Classification Search
USPC .............. 361/675–678, 679.46–679.54, 361/688–723, 752, 831
See application file for complete search history.

(56) References Cited

U.S. PATENT DOCUMENTS

| | | | | |
|---|---|---|---|---|
| 3,626,251 A * | 12/1971 | Vigue | ................. | 361/695 |
| 4,728,160 A * | 3/1988 | Mondor et al. | ................. | 312/236 |
| 4,774,631 A * | 9/1988 | Okuyama et al. | ................. | 361/695 |
| 4,911,231 A * | 3/1990 | Horne et al. | ................. | 165/104.34 |
| 5,123,478 A * | 6/1992 | Hosaka | ................. | 165/292 |
| 5,144,811 A * | 9/1992 | Brodie et al. | ................. | 62/176.6 |
| 5,718,628 A * | 2/1998 | Nakazato et al. | ................. | 454/184 |
| 5,796,580 A * | 8/1998 | Komatsu et al. | ................. | 361/679.48 |
| 6,086,476 A * | 7/2000 | Paquin et al. | ................. | 454/184 |
| 6,205,796 B1 * | 3/2001 | Chu et al. | ................. | 62/94 |
| 6,208,510 B1 * | 3/2001 | Trudeau et al. | ................. | 361/696 |
| 6,272,016 B1 * | 8/2001 | Matonis et al. | ................. | 361/716 |
| 6,305,180 B1 * | 10/2001 | Miller et al. | ................. | 62/259.2 |
| 6,557,357 B2 * | 5/2003 | Spinazzola et al. | ................. | 62/89 |
| 6,616,524 B2 * | 9/2003 | Storck et al. | ................. | 454/184 |
| 6,628,520 B2 * | 9/2003 | Patel et al. | ................. | 361/696 |
| 6,704,198 B2 * | 3/2004 | Replogle et al. | ................. | 361/690 |
| 6,742,583 B2 * | 6/2004 | Tikka | ................. | 165/291 |
| 6,775,137 B2 * | 8/2004 | Chu et al. | ................. | 361/696 |
| 6,798,657 B1 * | 9/2004 | Clifton et al. | ................. | 361/691 |
| 6,819,563 B1 * | 11/2004 | Chu et al. | ................. | 361/696 |
| 6,836,030 B2 * | 12/2004 | Smith et al. | ................. | 307/147 |
| 6,877,551 B2 * | 4/2005 | Stoller | ................. | 165/47 |
| 6,881,141 B2 * | 4/2005 | Knight | ................. | 454/184 |
| 6,896,612 B1 * | 5/2005 | Novotny | ................. | 454/184 |
| 6,924,981 B2 * | 8/2005 | Chu et al. | ................. | 361/696 |

(Continued)

FOREIGN PATENT DOCUMENTS

| FR | 2 568 712 A | 2/1986 |
|---|---|---|
| FR | 2568712 | 2/1986 |

(Continued)

OTHER PUBLICATIONS

International Search Report and Written Opinion mailed Feb. 25, 2009; PCT/US2008/010960; Lucent Technologies Inc., Applicant; 14 pages.

(Continued)

*Primary Examiner* — Courtney Smith
(74) *Attorney, Agent, or Firm* — Wall & Tong LLP

(57) ABSTRACT

A cabinet for housing and cooling electronic components with internally circulating air that is cooled at each of a plurality of equipment shelves.

20 Claims, 5 Drawing Sheets

(56) References Cited

U.S. PATENT DOCUMENTS

| | | | |
|---|---|---|---|
| 6,927,980 B2 * | 8/2005 | Fukuda et al. | 361/700 |
| 7,051,802 B2 * | 5/2006 | Baer | 165/299 |
| 7,135,877 B2 * | 11/2006 | Beaman et al. | 324/760 |
| 7,182,208 B2 * | 2/2007 | Tachibana | 211/26 |
| 7,184,267 B2 * | 2/2007 | Patel | 361/692 |
| 7,184,269 B2 * | 2/2007 | Campbell et al. | 361/700 |
| 7,187,549 B2 * | 3/2007 | Teneketges et al. | 361/699 |
| 7,226,353 B2 * | 6/2007 | Bettridge et al. | 454/184 |
| 7,286,351 B2 * | 10/2007 | Campbell et al. | 361/696 |
| 7,315,448 B1 * | 1/2008 | Bash et al. | 361/701 |
| 7,330,350 B2 * | 2/2008 | Hellriegel et al. | 361/679.48 |
| 7,365,973 B2 * | 4/2008 | Rasmussen et al. | 361/694 |
| 7,385,810 B2 * | 6/2008 | Chu et al. | 361/679.48 |
| 7,418,825 B1 * | 9/2008 | Bean, Jr. | 62/259.2 |
| 7,486,512 B2 * | 2/2009 | Campbell et al. | 361/694 |
| 7,492,593 B2 * | 2/2009 | Campbell et al. | 361/696 |
| 7,508,663 B2 * | 3/2009 | Coglitore | 361/695 |
| 7,643,291 B2 * | 1/2010 | Mallia et al. | 361/695 |
| 7,826,216 B2 * | 11/2010 | Moss | 361/679.49 |
| 7,869,210 B2 * | 1/2011 | Moss | 361/694 |
| 8,427,831 B2 * | 4/2013 | Wei | 361/699 |
| 2001/0042616 A1 * | 11/2001 | Baer | 165/299 |
| 2001/0052412 A1 * | 12/2001 | Tikka | 165/299 |
| 2002/0173266 A1 * | 11/2002 | Sharp et al. | 454/184 |
| 2002/0173267 A1 * | 11/2002 | Sharp et al. | 454/184 |
| 2003/0010477 A1 * | 1/2003 | Khrustalev et al. | 165/104.33 |
| 2004/0221604 A1 * | 11/2004 | Ota et al. | 62/259.2 |
| 2005/0047083 A1 * | 3/2005 | Kondo et al. | 361/689 |
| 2005/0174733 A1 * | 8/2005 | Novotny | 361/695 |
| 2005/0207116 A1 * | 9/2005 | Yatskov et al. | 361/690 |
| 2005/0225936 A1 * | 10/2005 | Day | 361/687 |
| 2006/0007657 A1 * | 1/2006 | Pfahnl et al. | 361/700 |
| 2006/0065386 A1 * | 3/2006 | Alam | 165/104.33 |
| 2006/0102322 A1 * | 5/2006 | Madara et al. | 165/104.21 |
| 2006/0120036 A1 * | 6/2006 | Rockenfeller | 361/688 |
| 2006/0126296 A1 * | 6/2006 | Campbell et al. | 361/700 |
| 2006/0176664 A1 * | 8/2006 | Casebolt | 361/687 |
| 2006/0180301 A1 * | 8/2006 | Baer | 165/299 |
| 2007/0151707 A1 * | 7/2007 | Lyons et al. | 165/104.21 |
| 2007/0165377 A1 * | 7/2007 | Rasmussen et al. | 361/695 |
| 2007/0211428 A1 * | 9/2007 | Doll | 361/695 |
| 2008/0002358 A1 * | 1/2008 | Casebolt | 361/687 |
| 2008/0055846 A1 * | 3/2008 | Clidaras et al. | 361/687 |
| 2008/0068793 A1 * | 3/2008 | Ishimine | 361/688 |
| 2008/0092387 A1 * | 4/2008 | Campbell et al. | 29/890.03 |
| 2008/0310112 A1 * | 12/2008 | Long et al. | 361/701 |
| 2009/0046423 A1 * | 2/2009 | Hom et al. | 361/694 |
| 2009/0126385 A1 | 5/2009 | Trepte | |
| 2009/0168345 A1 * | 7/2009 | Martini | 361/691 |

FOREIGN PATENT DOCUMENTS

| | | |
|---|---|---|
| JP | H09-298377 | 11/1997 |
| JP | 2004363308 (A) | 12/2004 |
| JP | 2005-530484 | 1/2006 |
| JP | 2005-249258 | 9/2006 |

OTHER PUBLICATIONS

May 23, 2012 Office Action in JP Patent Application No. 2010-526913, Alcatel-Lucent USA Inc., Applicant, 2 pages.

Apr. 15, 2013 Office Action in JP Patent Application No. 2010-526913, Alcatel-Lucent USA Inc., Applicant, 3 pages.

English Translation of Notification of Reason for Refusal for Japanese Patent Application Serial No. 2010-526913, dispatched Nov. 12, 2013, consists of 3 unnumbered pages.

May 27, 2014 Office Action in KR Patent Application No. 2010-7006996, 4 pages.

* cited by examiner

300A

RECIRCULATING GAS RACK COOLING ARCHITECTURE

FIELD OF THE INVENTION

The present invention relates to cooling systems and, more particularly, to cooling systems adapted for electronic systems such as those found in an equipment room such as at a telecommunications central office or computer data center.

BACKGROUND OF THE INVENTION

Equipment rooms at facilities such as telecommunications central offices and computer data centers and the like house electronic systems, electro-optical systems, photonic systems, computing systems and the like (generally speaking, equipment). The equipment is installed in racks within cabinets arranged in rows separated by aisles over a raised floor in an equipment room. Cold air exits the raised floor from "cold aisles" and is pulled through the cabinets by fans. The air egresses the cabinets in the "hot aisles" where it is pulled by room-level air blowers through a centrally located heat exchanger. The heat exchanger cools the air down and returns it to a compartment beneath the cold aisles of the raised floor of the equipment room.

Various modifications to the hot/cold aisles configuration are known. For example, one modification uses a fluid cooled heat exchanger to insure that air exiting from the cabinet is cooled to some extent before entering the equipment room hot aisle. The main purpose of this approach is to prevent heated air from the "hot aisle" inadvertently entering another cabinet from the front due to limited equipment room airflow control. Flow-balancing problems can create hot-spots within the equipment room as well. As the temperature of the air entering the raised floor is lowered, the cooling burden on the equipment room HVAC system is increased; however the air is not necessarily cooled to a sufficiently low level for use by the equipment shelves in the cabinets due to limited air flow distribution efficiency. It is also known to use refrigerant pumped loops with external chillers to augment a standard system. These units can be mounted in the ceiling above the cabinet, or directly on the cabinet, directing cool air towards the shelf intake vents. In addition, complex plumbing may be used to provide cooling fluids to individual circuit packs or circuit pack components.

SUMMARY

Various deficiencies of the prior art are addressed by the present invention of apparatus and methods for cooling heat-generating equipment such as within an equipment room, such as at a telecommunications central office or computer data center. In addition, an arrangement of cabinets for use within an equipment room is disclosed.

An apparatus according to one embodiment of the invention that is adapted to house heat generating components comprises: an enclosure, for substantially containing a circulating gaseous cooling medium in thermal communication with heat generating components; and a plurality of coolers, each cooler associated with one or more respective heat generating components, each cooler including a first heat exchanger to extract from the gaseous cooling medium at least a portion of heat imparted to the circulating gaseous cooling medium by respective heat generating components.

A method according to one embodiment of the invention comprises: circulating within an enclosed cabinet a gaseous cooling medium in thermal communication with a plurality of heat generating component groups; cooling the gaseous cooling medium proximate each heat generating component group with a respective first heat exchanger including a first medium; cooling the first medium of each of the first heat exchangers with a respective second heat exchanger including a second medium; and cooling the second medium of the second heat exchangers with a cooling device.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The invention will be primarily described within the context of a cabinet adapted to house equipment such as electrical systems, electronic systems, electro-optical systems, photonic systems, computing systems and the like. This type of equipment may be found within an equipment room at a telecommunications central office or computer data center. Those skilled in the art and informed by the teachings herein will realize that the invention is also applicable to any cabinet, housing or enclosure (or grouping thereof) in which cooling of heat generating components contained within is desired.

Any reference herein to particular equipment stored within racks (e.g., heat generating components, circuit cards and the like) is intended be broadly construed as referring to any type of equipment (electrical, optical, computing etc.). Moreover, any reference herein to a Central Office, Data Center and the like is intended to be broadly construed as referring to an equipment room or similar facility, such as might by found in any of a Central Office, Data Center and the like.

Generally speaking, present invention concerns a novel cabinet design and related methodology that uses recirculating air (or other gas) within an enclosed cabinet to cool the air exiting each stage or shelf in a cabinet. In one embodiment of the invention, increased acoustic damping is provided within (or outside of) the enclosed cabinet. In another embodiment of the invention, an atomized mist is introduced to the recirculating air or gas to provide enhanced evaporation-based cooling within the enclosed cabinet.

Figure 1:
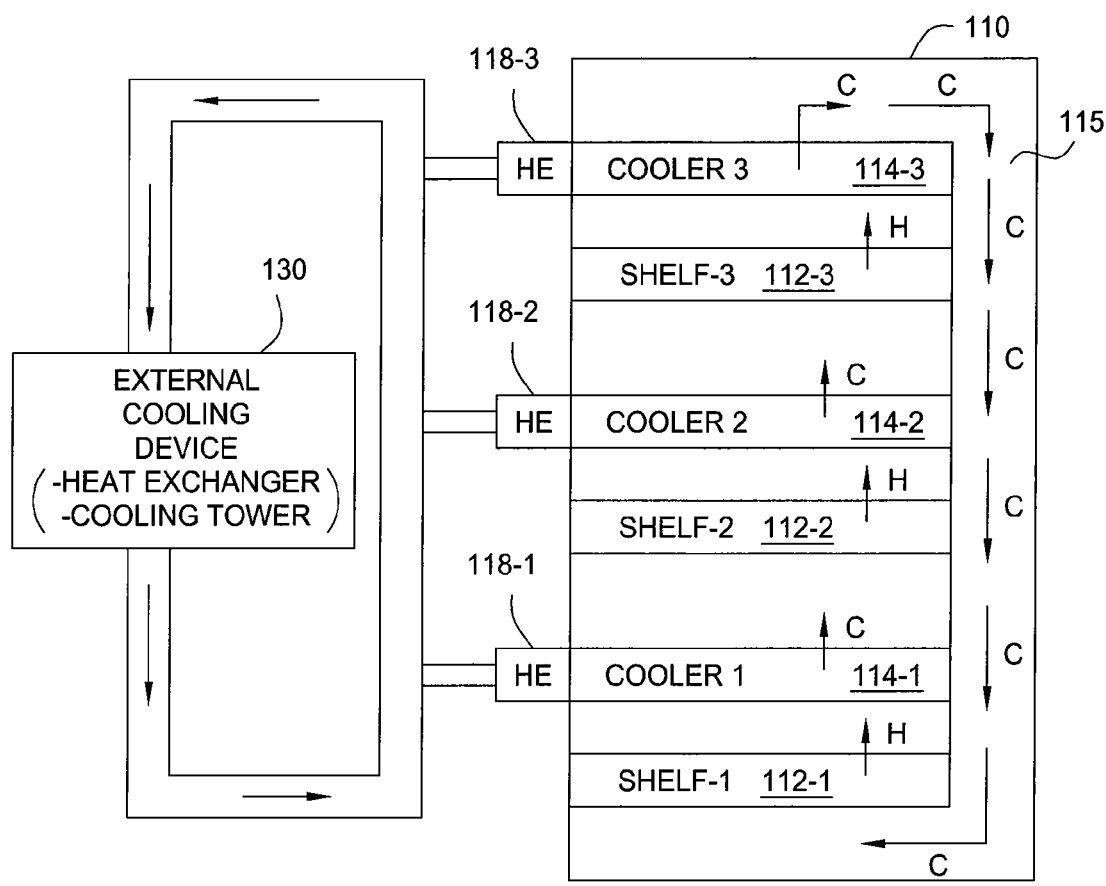
FIG. 1 depicts block diagram illustrating a cooling apparatus according to an embodiment of the present invention.

FIG. 1 depicts block diagram illustrating a cooling apparatus according to an embodiment of the present invention. Specifically, the cooling apparatus 100 comprises a substantially closed cabinet 110 including a plurality of shelves 112-1 through 112-3 (collectively shelves 112) for housing heat generating components such as electronic circuit packs or other heat generating components plugged into, illustratively, a common backplane.

Each of the shelves 112-1 through 112-3 is associated with a corresponding cooler 114-1 through 114-3 (located, illustratively, above the shelf). Each shelf 112 receives cooled air C from a preceding cooler 114 and passes heated air H to a next cooler 114. Each cooler 114 receives heated air from a preceding shelf 112 and passes cooled air C to a next shelf 112. Cooled air from the uppermost cooler 114-3 is recirculated through an air return zone 115 to the bottom shelf 112-1. In one embodiment, the cooler associated with the top shelf is instead positioned underneath the bottom shelf.

Each cooler includes a heat exchanger adapted to absorb heat from the warmed air received from a corresponding shelf 112. Heat from the warmed air is transferred into a medium within the cooler 114, thus providing a flow of cool air that can be used to cool the next shelf. The medium may comprise a fluid such as water, various dielectric materials and the like. The medium may also comprise a two-phase material (e.g., wax dispersion in fluid such as water). Thus, each cooler 114 includes an internal gas-to-liquid or gas-to-liquid+vapor type of heat exchanger, depending upon the selected design and type of first medium used.

In one embodiment, the coolers 114 include heat pipes having fins disposed thereon absorb heat from warmed air drawn across the fins. In one embodiment, the coolers 114 include capillary pumped loops.

Each of the coolers 114-1 through 114-3 is associated with a corresponding second heat exchanger 118-1 through 118-3. The second heat exchangers 118 are in thermal communication with each other and an external cooling device 130 via piping 120 to form thereby a external fluid cooling loop including a second medium. The second medium may be a fluid or a two-phase material. The second heat exchangers 118 may comprise liquid-to-liquid, liquid-to-liquid+vapor or liquid+vapor-to-liquid type of heat exchangers, depending upon the selected design and type of second medium used.

The second heat exchangers 118 are mounted in or on the cabinet 110 either separately, along with their respective coolers, or together. The coolers may be mounted separately or along with the heat exchangers (e.g., as a single unit).

The external cooling device 130 comprises, illustratively, a cooling device located in a different room than the cabinet, such as an outdoor cooling tower, heat exchanger, compressor and the like. In the case of a compressor or other refrigeration system, external access is appropriate to avoid condensation.

The cabinet may be conceptualized as having three zones; namely (1) an electronics zone including electronics or other heat generating devices associated with the different shelves 112; (2) an air-return zone; and (3) a fluid zone that contains the heat exchanger. Advantageously, the closed cabinet embodiment thus described operates independent of the thermal load limits imposed by the HVAC system of an equipment room since cooling is performed internally in conjunction with a fluid cooling loop. That is, heat is removed from each cabinet shelf by specifically arranged cooling mechanisms, rather than from an entire room via a large room cooling mechanism.

In one embodiment of the invention, there is a fan tray for each shelf. In another embodiment of the invention, there is one fan tray for the entire cabinet. In each case, the fan tray includes fans that are adapted to urge the circulation of air or gas across the heat generating components.

The invention advantageously provides for a closed cabinet such that the acoustic emanations are greatly reduced. Thus, by decreasing noise emanations the internally generated noise may be increased without exceeding ambient noise thresholds in the equipment room and remain within various safety specifications. Such increased noise may be devoted to increasing fan speed. By increasing the fan speeds associated with the cooling system described above, increased airflow and therefore increased cooling of the electronic circuit packs or other heat generating components is achieved.

In one embodiment, the first fluid comprises either a either single phase fluid or evaporating/condensing fluid and vapor. In one embodiment, the fluid or fluid/vapor is circulated passively by surface tension forces in a heat pipe and/or capillary pumped loop. In another embodiment, the fluid or fluid/vapor is actively pumped in and out of the cabinet through coils (not shown). The fluid may also contain a polymer-encapsulated phase change material (e.g., wax). This use of wax increases the heat capacity of the fluid by utilizing excess heat for a phase change (melting).

Any heat exchange between the second fluid (carried within cooling loop formed by second heat exchangers 118 and the external cooling device 130) and an external or building (facility) source of chilled water may be part of the cabinet or external to the cabinet within the CO and communicated by piping (not shown).

FIG. 1 depicts second heat exchangers 118 protruding from the cabinet. However, it should be noted that the inventors contemplate that these heat exchanges 118 will not protrude from the cabinet or otherwise alter the cabinet footprint. Moreover, in various embodiments the second heat exchangers 118 are integrated with the coolers 114.

Figure 2:
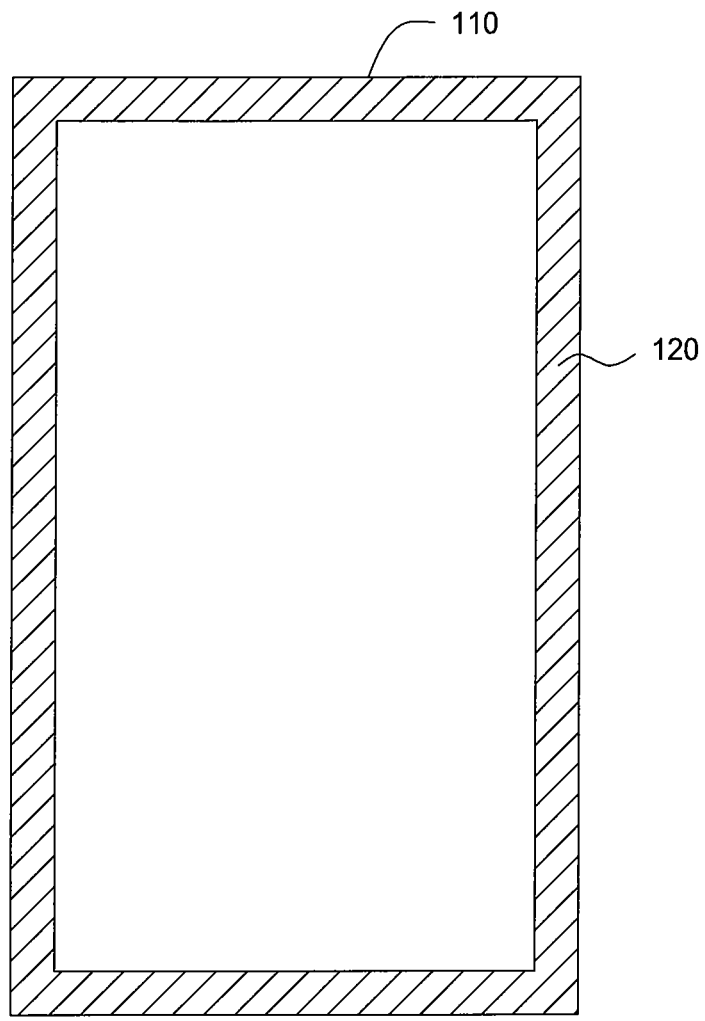
FIG. 2 depicts an enhancement to the cooling apparatus of FIG. 1.

FIG. 2 depicts an enhancement to the cooling apparatus of FIG. 1. Specifically, FIG. 2 depicts the cabinet 110 of FIG. 1 with all of the other components omitted for clarity. Acoustic emanations may be further reduced by the optional application of sound absorbing/deadening material within or around the cabinet. Thus, FIG. 2 depicts the cabinet 110 lined (internally) with acoustic piping 120 such that the sound emanating from the fans and other components within the cabinet 110 is further attenuated before leaving the cabinet 110. In this manner, additional increases in fan speeds may be achieved.

Figure 3A:
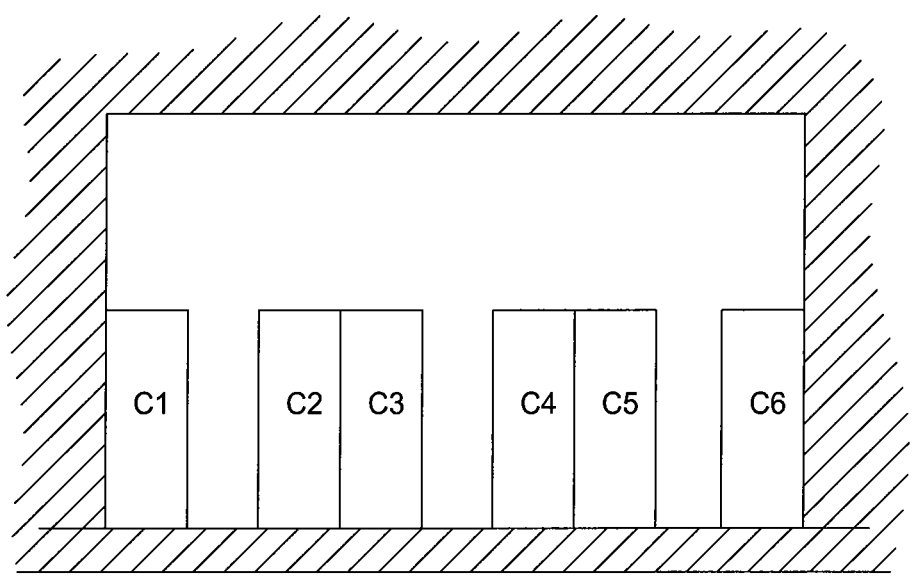
FIG. 3A depicts a side view of an arrangement of cabinets according to the invention such as within an equipment room.

FIG. 3A depicts a side view of an arrangement of cabinets according to the invention such as within an equipment room. Specifically, FIG. 3A depicts an arrangement 300A of a plurality of cabinets, illustratively denoted as cabinets C1-C6. It is noted that the cabinets in this configuration are located extremely close to each other, the only separations being those necessary for access to circuitry within the cabinets. As a practical matter, the cabinets C1-C6 may be butted up against each other if access is not needed or if a mechanism for moving the cabinets to a service position is provided. This arrangement, which benefits from the cooling advantages provided by the above described invention, greatly reduces the area needed to implement an equipment room such that a significant savings in floor space for a given number of cabinets is achieved. The arrangement of FIG. 3 is possible because the hot aisle and cold aisle structure (and raised floor associated with airflow ductwork) of prior art arrangements is not needed within the context of the present invention.

Figure 3B:
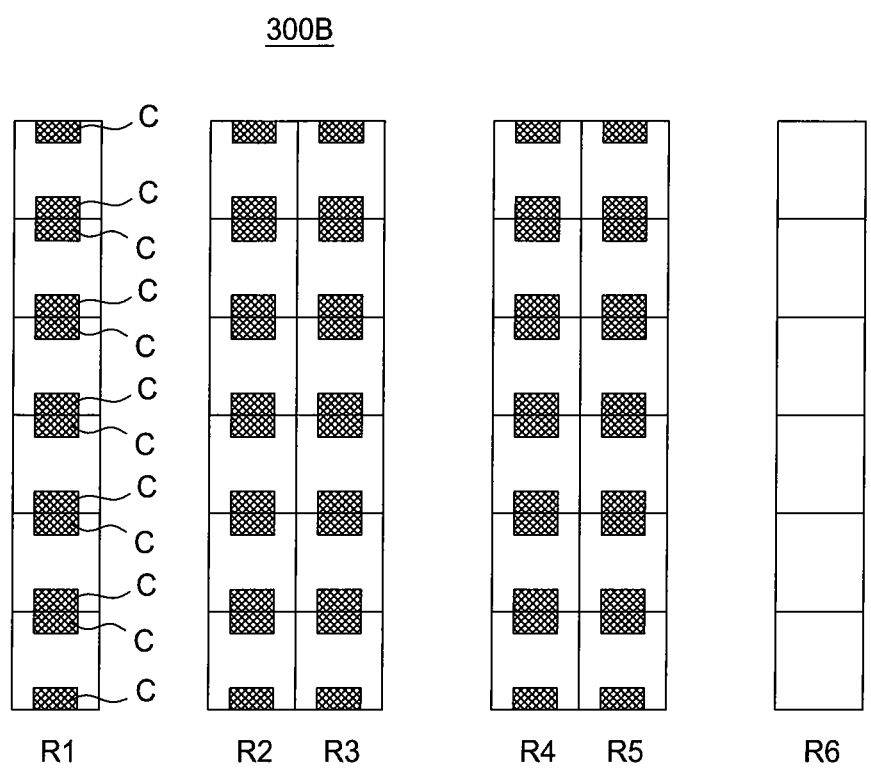
FIG. 3B depicts a top view of an arrangement of cabinets according to the invention such as within an equipment room.

FIG. 3B depicts a top view of an arrangement of cabinets according to the invention such as within an equipment room. Specifically, FIG. 3B depicts a top view of the cabinet arrangement depicted above with respect to FIG. 3A. The cabinet arrangement 300B of FIG. 3B is well adapted to an equipment room since the arrangement reduces the area necessary to support cabinets (compared to present solutions). Moreover, by avoiding the need for a raised floor and various room-size cooling systems, additional savings are realized.

The cabinet arrangement 300B of FIG. 3B shows, illustratively six rows of cabinets depicted as rows R1-R6. Each of the cabinets in row R1 is depicted as including a cooled air C, indicative of the placement of cooling apparatus within the cabinets. It can be seen by inspection that cooling apparatus with a cabinet may be located immediately next to cooling apparatus of an adjoining cabinet. The spacing between the various rows is provided primarily for service access to the various electronics shelves within the cabinets. The cabinets themselves are closed cabinet having internally circulating air cooling mechanisms, air-fluid cooling mechanisms and fluid-fluid cooling mechanisms as described above with respect to FIGS. 1-2.

In one embodiment, the second heat exchangers of two or more cabinets are in fluid communication with each other. In one embodiment, the second heat exchangers of each cabinet are in fluid communication with the second heat exchangers of an adjoining cabinet. In one embodiment, the second heat exchangers of each cabinet in a row are in fluid communication with the second heat exchangers of each other cabinet in the row.

Figure 4A:
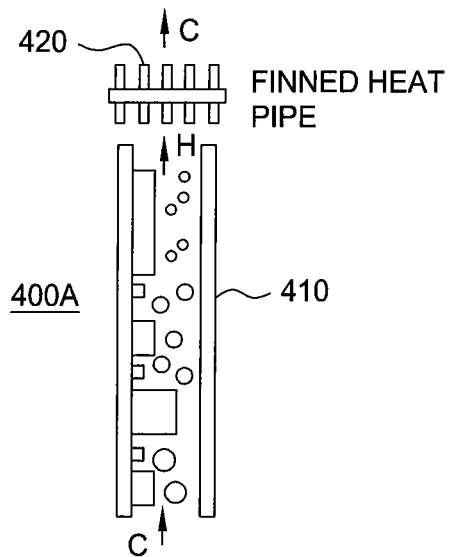
FIG. 4A depicts an enhancement to the cooling apparatus of FIG. 1 or FIG. 2.

FIG. 4 depicts an enhancement to the cooling apparatus described above with respect to FIG. 1 or 2. Specifically, FIG. 4A depicts circuit pack cooling arrangement 400A in which a populated circuit pack 410 (such as found on a shelf 112 in the cabinet 100 of FIG. 1) receiving cool airflow C from underneath and producing hot airflow H on top. The heat from the hot airflow H heats is removed by a finned heat pipe 420 (such as found on a cooler 114 in the cabinet 100 of FIG. 1) to produce cool airflow C. The air/heat flow depicted in FIG. 4A substantially conforms to that described above with respect to the various figures.

Figure 4B:
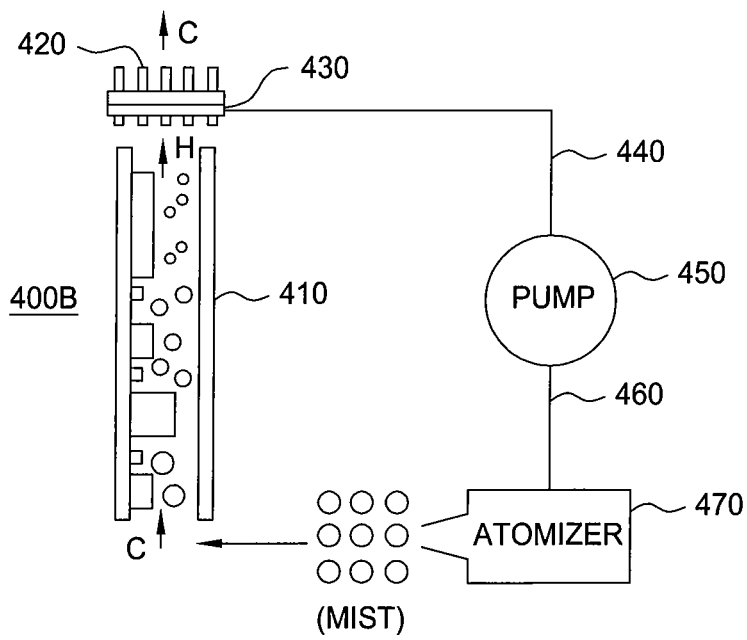
FIG. 4B depicts an enhancement to the arrangements described above

FIG. 4B depicts an enhancement to the arrangements described above. Specifically, FIG. 4B depicts circuit pack cooling arrangement 400B in which enhanced cooling is provided by injecting into the cooling airflow a mist (i.e., an atomized fluid). In this embodiment, the mist or atomized fluid is injected into the cooling airflow by an atomizer 470 such as a mechanical, ultrasound or other type of atomizer. The mist droplets absorb heat from the populated circuit pack and vaporize. The vaporized mist droplets are condensed by the cooler 114 into a fluid which is collected at a collector 430. The condensate is collected by gravity causing it to buildup in a collector (e.g., a rectangular or triangular cross section (open) container hanging off a heat pipe). Optionally, the collector is slightly tilted to facilitate draining of the condensate toward a pump. A pump 450 extracts the fluid from collector 430 via a pipe 440 and conveys the extracted fluid to atomizer 470 via a pipe 460. The atomizer 470 atomizes the fluid for reintroduction into the cooling airflow as noted above. The mist operates to inhibit the temperature increase of the air flowing through the shelves. Thus, the air is cooler and more efficient as a heat transfer medium. Similar effects are realized by increased airflow (e.g., increased fan speeds).

In one embodiment, the mist (or the cooling fluid itself) is directed by a gravity-fed or pump-fed pipe or nozzle directly onto or towards individual components to provide enhanced cooling of the individual components. This intentional directing is extremely useful to accommodate certain high-powered components, regardless of whether or not the mist is used to cool the air stream itself in general. It is also noted that this mist is able to provide back up cooling in the case that water or other fluid lines or fans fail. If a cooling water/fluid circulation loop failed, then the mist would stop condensing because of a lack of cooling fluid, but a reservoir of mist would delay intolerable operating conditions for the hardware in the cabinet. If the fans failed, then spraying the mist, collecting the condensate and re-spraying the condensate as mist would be of significant benefit in cooling the system. Some failsafe mechanisms are described in more detail below.

In the embodiment of FIG. 4B, the temperature change between the inlet and exit of the circuit pack is less than the corresponding temperature change in the embodiment of FIG. 4A. For example, the inventors have determined in one case that when the inlet temperature to the circuit pack 410 in either embodiment of FIG. 4 is approximately 20° C., the outlet temperature from the circuit pack for 10 is approximately 35° C. (FIG. 4A) or 27.5° C. (FIG. 4B).

The atomized mist described above may be used in three ways (either singly or in any combination) to (1) to increase the overall cooling capacity of the air flow; (2) prevent the air temperature from rising as fast as it normally would as it flows upward (upstream) through the shelves/circuit packs in a cabinet; and/or (3) to be sprayed directly on components to provide extra, localized cooling.

The various embodiments of the invention depicted above may also be combined. That is, the closed cabinet circulation embodiment of FIG. 1 may be augmented by the acoustic shielding described with respect to FIG. 2 (thereby allowing greater fan speed) and/or enhanced cooling may be provided by the circulation of mist and/or direct application of mist/fluid described with respect to FIG. 4. The use of mist is possible in the closed system of the present invention, where in an open system the mist would dissipate.

In one embodiment of the invention, air is depicted as a cooling medium recirculated through a cabinet. However, in other embodiments, other gases are used as recirculating cooling mediums. Such other gases may include, for example, Helium. Generally speaking, any gas having a heat capacity approximating or greater than that of ordinary air may be used for this purpose.

Heat pipes are tubes containing a fluid that vaporizes at a hot end (air-side in the above examples) and condenses at a cool end (e.g., water-side) in order to transfer heat from the hot end to the cool end. The condensate is passively pumped from the cool end back to the hot end by surface tension forces due to, for example, a capillary wick inside the heat pipe. Heat pipes typically have very low thermal resistance, 1/10th or less that of pure Cu of the same diameter, but can only transfer a limited amount of heat because surface tension forces have limited strength and the like.

In one embodiment of the invention, heat pipes are used to implement the air-to-fluid-side heat transfer functions described above. In other embodiments of the invention, a pumped refrigerant (e.g., with a remote heat exchanger for condensation to take place rather than a fluid-zone in the rack) is used. In still other embodiments, capillary pumped loops (similar to heat pipes, but with much higher capacity and in the form of a closed loop rather than a pipe) or pumped water is used.

In one embodiment of the invention, a "failsafe" mode of operation is provided to avoid deleterious consequences in the event of fan failure, chilled water failure, atomizer failure and so on. It is noted that a chiller may fail if the water is not cold or if a pump fails. Since the cabinets used within the context of the invention are closed cabinets, such a failure may quickly have dire consequences.

One failsafe mode comprises a large sets of louvers that automatically open as soon as the fans stop (or a pump or other cooling-related device fails). The louvers are preferably located at the bottom of the cabinet to let cool room air in and at the top of the cabinet to let heated air out. A second fan, or set of fans may optionally be included to blow air through the cabinet (e.g., one large fan at the top, optionally battery powered). On the building-chilled water side, a fail safe mechanism is less important and easier to arrange. The fluid itself preferably has a reasonable heat capacity such that it could continue to absorb heat for, illustratively, a few minutes. In one embodiment, secondary piping and an (optionally) battery operated pumping system with a chilled water storage tank (e.g., gravity fed) is provided, such as on the ceiling or roof. In this manner, should the main pumps fail, a normally closed valve opens to allow the flow of chilled water to be gravity fed and/or pumped into the system for a short period of time.

Phase change material (PCM) is another option when the building chilled water pump fails. Thus, in one embodiment, a return duct is lined with a phase change material such as a powder that melts at a specified temperature such as 40° (e.g., a temperature the return air should never reach unless a cooling water/refrigerant shut down condition has occurred). As the encapsulated PCM melts, which would take some time (e.g., 30 minutes) due to their large latent heat of fusion, the air would be cooled as it recirculates from the outlet of the last shelf back to the inlet of the first shelf. PCM may also be dispersed in the gravity fed cooling water that would only be used in an emergency, further increasing its thermal energy absorbance capacity.

In still a further embodiment, a means to prevent condensation within the cabinet is provided. In this embodiment, a regulator valve on the chilled water (or chilled fluid) intake port is used. If the regulated equipment is idling and the chilled water requirement is low, then a valve limits the flow rate and thus the cooling capacity of the system. In this way, the air temperature in cabinet is not reduced to the point where condensation forms.

In still a further embodiment, an additional heat exchanger on the fluid side is provided. In this embodiment, rather than water being circulated over the fluid side of the fins, a dielectric fluid (oil or fluorocarbon) is circulated instead after being cooled by a building (or other) chilled water source. Especially in the case of the fluorocarbon, fire safety from unintended leaks is inherently eliminated. In either case, the dielectric fluid is preferably controlled and filtered, thus reducing maintenance on the fluid-side fins. Some fluids of interest for this application include Paratherm, Dynalene, HFE7100 and HFC245fa.

In still another embodiment of the invention, an intermediate heat exchanger is provided. This intermediate heat exchanger has its own cooling capacity (e.g., compressor-based) and optionally provides increased cooling capacity should building chilled water (or the dielectric fluid that exchanges heat with it) be desired to be below the building chilled water temperature available to the CO.

The various processes described above as apparatus functionality may also be construed as a methodology for cooling. Thus, for example, one embodiment of the invention comprises circulating within an enclosed cabinet a gaseous cooling medium in thermal communication with a plurality of heat generating component groups; cooling the gaseous cooling medium proximate each heat generating component group with a respective first heat exchanger including a first medium; cooling the first medium of each of the first heat exchangers with a respective second heat exchanger including a second medium; and cooling the second medium of the second heat exchangers with a cooling device.

In another embodiment of the invention, an evaporator section of a refrigeration cycle functions as the cooler(s) in the rack or cabinet. That is, evaporating fluid (refrigerant) in the evaporator section is the medium that absorbs heat in the shelf coolers. This absorbed heat is released in a condenser section of the same refrigeration cycle. This refrigeration cycle comprises, illustratively, the second heat exchangers and can optionally be mounted on the back or side of the cabinet, as well as external to the cabinet (i.e., separate from the gaseous cooling stream in the cabinet). The associated the compressor and expansion valve of this refrigeration cycle are mounted somewhere external to the rack.

In one embodiment, the temperature of the evaporator section is controllable. In one embodiment, pressure at an outlet of the expansion valve is adjustable, which adjustments provide a mechanism to control the temperature in the evaporator section. Thus, if condensation became possible then an adjustment of the valve is provided to increase evaporator section temperature and avoid the condensation. Alternatively, the outlet pressure is controlled by controlling the pressurization of refrigerant by the compressor.

While the foregoing is directed to various embodiments of the present invention, other and further embodiments of the invention may be devised without departing from the basic scope thereof. As such, the appropriate scope of the invention is to be determined according to the claims, which follow.

What is claimed is:

1. An apparatus adapted to house heat generating components, the apparatus comprising:
    an enclosure for containing a gaseous cooling medium circulating therein through a zone including the heat generating components and a return zone;
    a plurality of coolers located inside of said enclosure so that said zone includes the plurality of coolers, each cooler associated with a respective one or more of said heat generating components, each cooler including a first heat exchanger having a first medium to extract from the circulating gaseous cooling medium at least a portion of heat imparted to the circulating gaseous cooling medium by the respective heat generating components;
    a plurality of second heat exchangers, each second heat exchanger associated with a respective cooler and including a second medium or a two-phase material adapted to extract heat from the respective cooler, wherein each of the second heat exchangers is in fluid communication with chilled fluid from an external cooling device, the chilled fluid adapted to extract heat from the plurality of second heat exchangers; and
    a chilled fluid intake port regulator valve to limit a chilled fluid flow rate to prevent condensation within the enclosure.

2. The apparatus of claim 1, wherein the second heat exchangers comprise any of a liquid-to-liquid, vapor+liquid-to-liquid, and liquid-to-liquid+vapor type heat exchanger.

3. The apparatus of claim 1, wherein the external cooling device comprises one of a cooling tower, a heat exchanger and a compressor.

4. The apparatus of claim 1, further comprising:
    an atomizer, for atomizing a dielectric fluid into a mist for introduction into the recirculating gaseous cooling medium.

5. The apparatus of claim 4, wherein the atomizer comprises one of a mechanical atomizer and an ultrasonic atomizer.

6. The apparatus of claim 4, further comprising:
    means for condensing vaporized mist back into the dielectric fluid; and
    a pump, for pumping the dielectric fluid to the atomizer.

7. The apparatus of claim 4, further comprising:
    means for directing the mist towards a specific heated component.

8. The apparatus of claim 1, further comprising:
    means for directing a dielectric fluid towards a specific heated component.

9. The apparatus of claim 1, further comprising:
a failsafe mechanism adapted to delay an overheating condition in the event of a cooling failure.

10. The apparatus of claim 9, wherein the failsafe mechanism comprises cabinet louvers adapted to open in response to the failure.

11. The apparatus of claim 9, wherein the failsafe mechanism comprises at least one of cabinet louvers adapted to open in response to the failure and one or more backup fans adapted to operate in response to the failure.

12. The apparatus of claim 9, wherein the failsafe mechanism comprises a phase change material (PCM) disposed within one of a cooling duct and a gravity fed fluid backup device.

13. The apparatus of claim 1, further comprising:
an additional heat exchanger for recirculating a dielectric fluid over side fins of the first heat exchangers.

14. The apparatus of claim 13, wherein the dielectric fluid comprises one of Paratherm, Dynalene, HFE7100 and HFC245fa.

15. The apparatus of claim 1, further comprising:
a plurality of shelves for supporting said heat generating components associated with the coolers, each of the shelves adapted to direct the gaseous cooling medium toward respective heat generating components.

16. The apparatus of claim 15, wherein:
a lowest of the plurality of shelves receives the recirculating gaseous cooling medium via a recirculation region; and
the remaining of the plurality of shelves receives the recirculating gaseous cooling medium via a lower cooling device.

17. An equipment room including a plurality of cabinets formed according to the apparatus of claim 1, wherein said plurality of cabinets are arranged in multiple rows, said second heat exchangers of at least two cabinets being in fluid communication with each other.

18. The equipment room of claim 17, wherein the equipment room is located within one of a Central Office facility and a Data Center facility.

19. A method, comprising:
recirculating a gaseous cooling medium through a heat generating component zone and a return zone within an enclosed cabinet, said gaseous cooling medium in thermal communication with a plurality of heat generating component groups within said heat generating component zone;
cooling the gaseous cooling medium proximate each heat generating component group with a respective first heat exchanger, each first heat exchanger including a first medium to extract from the recirculating gaseous cooling medium at least a portion of heat imparted to the recirculating gaseous cooling medium by the respective heat generating component group, each respective first heat exchanger being located inside of said enclosed cabinet so that said heat generating component zone includes said each respective first heat exchanger;
cooling the first medium of each of the first heat exchangers with a respective second heat exchanger including a second medium;
cooling the second medium of each of the second heat exchangers with a chilled fluid in thermal communication with each of the second heat exchangers and having a flow rate regulated such that condensation within the enclosed cabinet is avoided.

20. The apparatus of claim 1, wherein the enclosure is coated with acoustic shielding material to thereby attenuate sound emanating from components within the cabinet.

* * * * *